United States Patent
Bond et al.

(10) Patent No.: US 6,376,272 B1
(45) Date of Patent: Apr. 23, 2002

(54) INA1AS ETCH STOP LAYER FOR PRECISE SEMICONDUCTOR WAVEGUIDE FABRICATION

(75) Inventors: Aaron Eugene Bond, Macungie; Abdallah Ougazzaden, Emmaus, both of PA (US); Gleb E. Shtengel, Baltimore, MD (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/588,427

(22) Filed: Jun. 6, 2000

(51) Int. Cl.⁷ .................. H01L 21/00; H01S 5/00; G02B 6/10
(52) U.S. Cl. .................. 438/31; 372/45; 385/130
(58) Field of Search .................. 438/31, 39, 507, 438/689, 706, 735, 737, 738, 970; 257/98, 623; 372/45, 46; 385/14, 129, 130, 131

(56) References Cited

U.S. PATENT DOCUMENTS 5,987,046 A * 11/1999 Kobayashi et al. .......... 372/45

* cited by examiner

Primary Examiner—Keith Christianson
(74) Attorney, Agent, or Firm—Christie, Parker & Hale, LLP

(57) ABSTRACT

A semiconductor waveguide device and method for forming the same provide an InAlAs film as an etch stop layer. The InAlAs film does not etch in the $CH_4/H_2$ etch chemistry used to produce the device using reactive ion etching techniques. The etching process etches the waveguide layer and cladding layer or layers formed above the InAlAs layer, and exposes the InAlAs etch stop film to produce a waveguide device having desired physical characteristics.

25 Claims, 3 Drawing Sheets

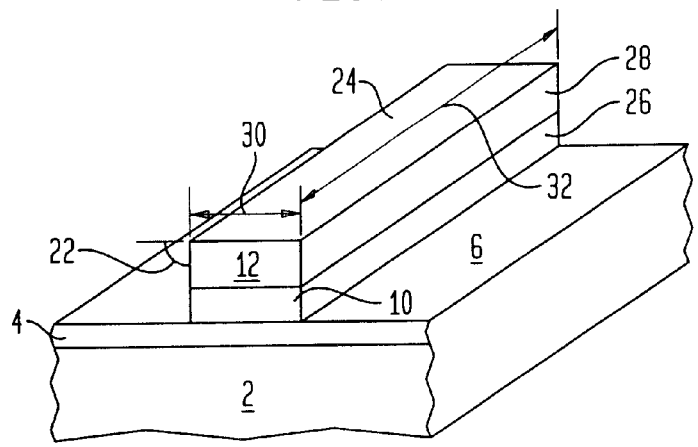
FIG. 5
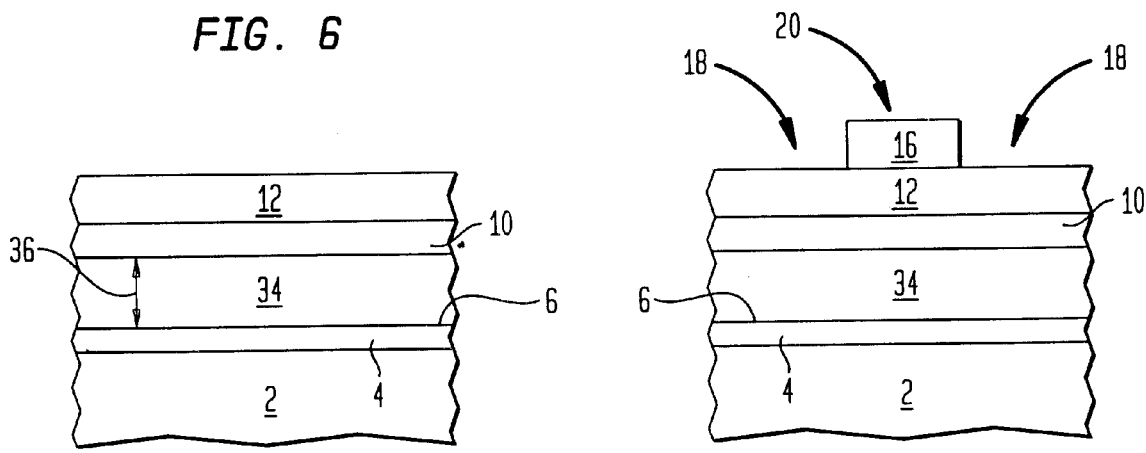
FIG. 6
FIG. 7
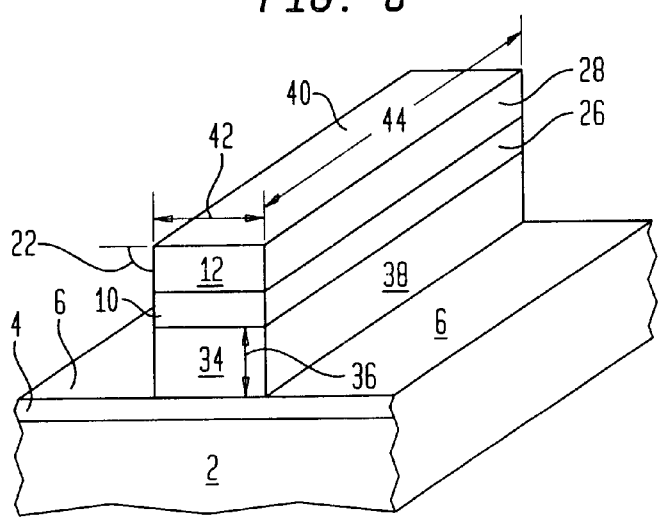
FIG. 8

US 6,376,272 B1

INA1AS ETCH STOP LAYER FOR PRECISE SEMICONDUCTOR WAVEGUIDE FABRICATION

TECHNICAL FIELD

The present invention relates most generally to semiconductor waveguide devices, and methods for forming the same.

BACKGROUND OF THE INVENTION

In recent years it has become practical and cost-effective to fabricate waveguide devices from silicon or other semiconductor substrates. Semiconductor waveguide devices consist of a waveguide layer interposed between cladding layers. Light travels along the waveguide layer and is therefore confined between the cladding layers. This is so because the waveguide layer and the cladding layers are chosen such that the refractive index of the waveguide layer is greater than that of the cladding layers between which the waveguide layer is disposed. Generally, the waveguide structure includes a mesa structure formed on a semiconductor substrate and the mesa structure includes the waveguide layer. Above and below the waveguide layer are cladding layers. The upper cladding layer forms part of the mesa structure while the lower cladding layer may form part of the mesa structure and/or part of the base structure above which the mesa structure extends. Since the waveguide layer is formed within a mesa, it is laterally exposed to air which also includes a refractive index being less than that of the waveguide layer.

The ability of the semiconductor waveguide device to confine light depends on the materials used and the physical surroundings of the waveguide layer. Semiconductor waveguide devices are typically fabricated from a waveguide layer which is clad or bounded by dielectric or other materials with lower indices of refraction than the waveguide layer. This allows the light to propagate within the waveguide with very little attenuation due to the confinement of the light waves by total internal reflection. The light beam-confining ability of the waveguide device therefore depends upon the differences of the refractive indices between the cladding layer and the waveguide layer. The beam confming qualities of the waveguide layer are important because they determine the far field characteristics of the waveguide device which, in turn, affect the optical coupling ability of the waveguide device. Semiconductor waveguide devices may be adapted for various means of optical coupling and may serve various applications such as a light absorbing function or a beam expanding function. As such, the far field and degree of beam confinement required, may vary depending on the application of the semiconductor waveguide.

For any given set of materials having a fixed set of respective refractive indices, then, the beam confining ability of the semiconductor waveguide device depends upon the physical arrangement of the waveguide layer and the adjacent cladding layers. Examples of various semiconductor waveguide structures are shown in FIGS. 9–12. In FIGS. 9–12, waveguide layer 101 is formed having a commonly used cladding layer, InP, above and below waveguide layer 101. The shape and relative position of waveguide layer 101 with respect to mesa structure 103 and base surface 105, influence the beam-confming characteristics of the waveguide device for a given set of materials. The waveguide device is conventionally formed by providing a series of films such as waveguide layer 101 and the upper InP cladding layer, over a substrate or base layer of another cladding material such as InP. Thereafter, a pattern is formed using a masking material 109 and an etch process is used to remove a succession of films from unprotected or exposed regions. It can be understood that the point at which the etch process is terminated, determines where waveguide layer 101 will be disposed relative to the mesa structure 103 formed. For example, in FIGS. 9 and 10, waveguide layer 101 is part of the mesa structure and is bounded laterally by air. In FIG. 11, the etch process is stopped so that waveguide layer 101 forms the base surface 105 above which mesa 103 extends. It can be further seen that in FIG. 12, the etch process is stopped prior to exposing waveguide layer 101, and therefore mesa structure 103 only includes portions of the upper cladding layer InP.

The various types of structures formed and the various dimensions of the structures formed, such as height 107 of waveguide layer 101 above surface 105 as shown in FIG. 9, and depth 117 of waveguide layer 101 beneath base surface 105 as shown in FIG. 12, determine the beam-confining qualities of the semiconductor waveguide device. For example, a light beam being propagated through waveguide layer 101 of the structure shown in FIG. 9, would likely be a tightly confined beam. In contrast, a light beam being propogated through waveguide layer 101 of the structure shown in FIG. 12, would be an unconfined, or weakly confined light beam. The structures shown in FIGS. 10 and 11 provide other beam-confining qualities. Depending on the intended application, various beam-confining abilities may be desired.

The etching process commonly used to form the mesa structures as shown in FIGS. 9–12, includes a mixture of $CH_4/H_2$ as etchant gases. This etch gas chemistry is preferred because of its ability to etch the various cladding layers and waveguide layers used to form semiconductor waveguide devices. Because of this ability, a single etching process can be used to form the entire mesa structure by sequentially etching the films. The etch gas chemistry of $CH_4/H_2$ is most highly favored, however, because of its ability to produce mesa structures having relatively vertical sidewalls. Mesa structures produced using the $CH_4/H_2$ etch gas chemistry, commonly include sidewall angles of 88° to 90° with the horizontal.

One shortcoming associated with the use of the $CH_4/H_2$ etch chemistry to sequentially etch a series of films as shown in FIGS. 9–12, is that the stopping point of the etching process cannot be accurately controlled. Regardless of the particular waveguide structure sought, it is important to accurately and precisely end the etch process at the appropriate time so as to form the desired structure.

The conventional method for "endpointing" the etching process is simply to etch for a given time since all of the films will etch in the $CH_4/H_2$ etch chemistry used. Due to localized and substrate-to-substrate variations in the various films' etch characteristics, and localized and run-to-run variations of the conditions within etch reactors, it is extremely difficult to predetermine an etch time which will reliably produce the particular waveguide structure desired and do so repeatedly. Once a series of films is formed such as a cladding layer formed over a waveguide layer formed, in turn, over an underlying cladding layer, and an etch process is carried out, any of the various structures shown in FIGS. 9–12 may result for a given etch time, due to etch rate variations as noted above. The structures produced may vary on a run-to-run basis or they may vary within a single substrate.

As such, it can be seen that there is a need in the art to provide an etching process which has an accurately controllable stopping point, and which therefore produces a semiconductor waveguide structure having the physical configuration desired for the specific waveguide application intended.

SUMMARY OF THE INVENTION

To address these and other needs, and in view of its purposes, the present invention provides a method for forming a semiconductor waveguide device which utilizes an etch stop layer of InAlAs. The etching chemistry includes a gas mixture of $CH_4/H_2$ which sequentially etches a series of films which form the various waveguide layers and cladding layers above the InAlAs layer. The etching process is used to produce a mesa structure used as a semiconductor waveguide device. The relative placement of the InAlAs layer with respect to the cladding layer or layers and the waveguide layer formed above it, determines the mesa structure and, hence, the waveguide structure formed above the InAlAs, because the InAlAs material does not etch in the $CH_4/H_2$ etching chemistry used to etch the cladding layers and waveguide layers. Another aspect of the present invention is the waveguide device formed, as above, which includes a structure having physical dimensions which may be accurately predetermined and which therefore can be reliably produced to include desired beam-confining qualities.

It is to be understood that both the foregoing general description and the following detailed description are exemplary, but not restrictive, of the invention.

BRIEF DESCRIPTION OF THE DRAWING

The invention is best understood from the following detailed description when read in connection with the accompanying drawing. It is emphasized that, according to common practice, the various features of the drawing are not to-scale. On the contrary, the dimensions of the various features are arbitrarily expanded or reduced for clarity. Included in the drawing are the following figures:

FIG. 5 is a perspective view of the first exemplary embodiment of the waveguide structure also shown in FIG. 4;

FIG. 6 is a cross-sectional view showing multiple films used to form a waveguide device according to a second exemplary embodiment;

FIG. 7 is a cross-sectional view showing a pattern formed in a masking film over the second exemplary embodiment shown in FIG. 6;

FIG. 8 is a perspective view showing the second exemplary embodiment of the waveguide device formed from the structure shown in FIG. 7;

DETAILED DESCRIPTION OF THE INVENTION

The present invention addresses the problem of producing semiconductor waveguide devices having different physical structures and different physical dimensions, by providing a method for forming a semiconductor waveguide device which includes the use of InAlAs as an etch stop layer. By forming the InlMAs layer at an appropriate position with respect to the various other is waveguide and cladding layers used to form the waveguide device, the dimensions of the mesa structure including the location of the waveguide layer formed above the InAlAs layer, can be controlled because the InAlAs layer does not etch in the etch chemistries used to etch and remove the various layers formed above the InAlAs layer. The present invention overcomes the conventional problem of not being able to accurately end the etching process at the precise time that the desired waveguide structure is formed.

Figure 1:
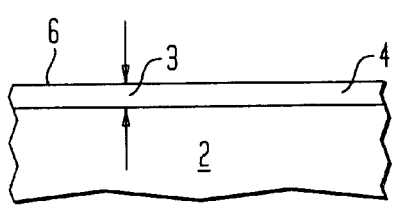
FIG. 1 is a cross-sectional view showing an InAlAs etch stop layer formed over a semiconductor substrate according to a first exemplary embodiment.

Referring now to the drawing, in which like reference numbers refer to like elements throughout, FIG. 1 shows substrate 2 above which InAlAs layer 4 is formed. InAlAs (indium-aluminum-arsenic) layer 4 may be formed using various methods available in the art. In a preferred embodiment, MOCVD (metallo-organic chemical vapor deposition) may be used to form InAlAs layer 4. The InAlAs layer 4 so formed, is not limited to a stoichiometric or other fixed ratio of the indium, aluminum and arsenic which combine to form the layer. Rather, various compositions may be used. InAlAs layer 4 includes top surface 6 which, as will be seen later, will form a base surface above which a mesa including a waveguide layer, will be formed. InAlAs layer 4 includes thickness 3. According to an exemplary embodiment, thickness 3 maybe on the order of 200 angstroms, but any suitable thickness equal to or greater than 50 angstroms may be used alternatively. In an exemplary embodiment, substrate 2 may be a semiconductor substrate such as a silicon wafer commonly used in the semiconductor manufacturing industry. In an alternative embodiment, substrate 2 may be another semiconductor material such as inP which may be appropriately used as a further cladding layer.

Figure 1A:
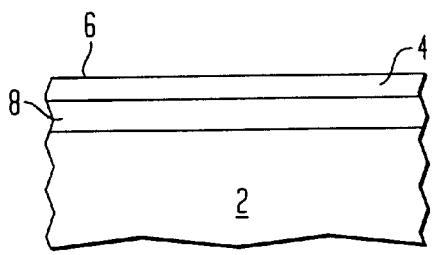
FIG. 1A is an alternative embodiment showing an InAlAs etch stop layer formed over a cladding layer formed over a semiconductor substrate.

FIG. 1A shows an alternative embodiment wherein cladding layer 8 is formed between substrate 2 and InAlAs layer 4. According to this alternative embodiment, cladding layer 8 may be formed over base substrate 2 using conventional methods such as MOCVD and may comprise InP in a preferred embodiment. Substrate 2 may be a conventional silicon wafer commonly used in the semiconductor manufacturing industry.

According to either of the embodiments shown in FIGS. 1 and 1A, InAlAs layer 4 may function as a cladding layer and may be additionally doped with an N-type or P-type dopant impurity depending on device requirements. Conventional methods may be used to introduce the dopant impurities into the InAlAs layer.

Figure 2:
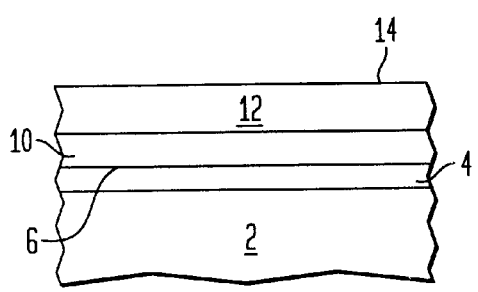
FIG. 2 is a cross-sectional view showing a waveguide layer and upper cladding layer formed over the structure shown in FIG. 1.

Now turning to FIG. 2, a duality of additional films are formed over the structure shown in FIG. 1. According to this first exemplary embodiment of a waveguide structure formed according to the present invention, waveguide layer 10 is formed over top surface 6 of InAlAs layer 4. Over waveguide layer 10 is formed upper cladding layer 12. Each of waveguide layer 10 and upper cladding layer 12 may be formed using various methods conventionally available in the art. According to a preferred embodiment, MOCVD techniques may be used to form each of waveguide layer 10 and upper cladding layer 12. Upper cladding layer 12 includes top surface 14. Various suitable materials may be used to form the respective layers 10 and 12. The layers are chosen such that the refractive index of waveguide layer 10 is greater than that of each of upper cladding layer 12 and InAlAs layer 4. Waveguide layer 10 and upper cladding layer 12 may be formed to any suitable thickness commonly used in the art to form semiconductor waveguide devices. Waveguide layer 10 may be formed of conventional waveguide layer materials such as InGaAs and InGaAsP, but other suitable waveguide materials may be used. For each of exemplary waveguide layers InGaAs and InGaAsP, any suitable combination of the elements used to form the respective layers, may be used. Waveguide layer 10 will generally be an un-doped, or intrinsic material. Upper cladding layer 12 may be any suitable cladding layer used in the art, such as InP. Upper cladding layer 12 may be doped with either N-type or P-type dopant impurities using conventional methods and depending upon device requirements.

Figure 3:
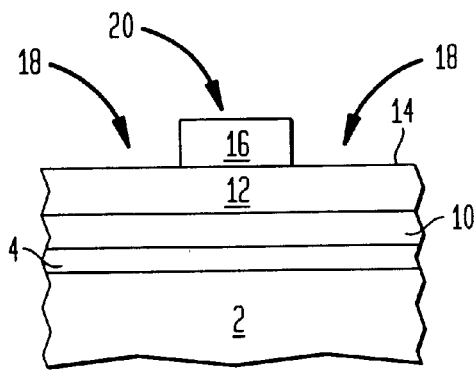
FIG. 3 is a cross-sectional view-showing a pattern formed using a masking material over the structure shown in FIG. 2.

FIG. 3 shows a pattern formed of masking material 16 over the structure shown in FIG. 2. The pattern includes exposed regions 18 and protected region 20 which is covered by masking film 16. Conventional masking films and methods for forming a pattern may be used. According to various exemplary embodiments, masking film 16 may be a photoresist or oxide (silicon dioxide) film which will serve as a masking material during subsequent etching processes. An exemplary method may be to photolithographically form a pattern in a photoresist material.

The structure shown in FIG. 3 is then subjected to a reactive ion etching (RIE) process which sequentially removes exposed portions 18 of upper cladding layer 12 and waveguide layer 10, but does not attack InAlAs layer 4. The etching process includes an etchant gas mixture of $CH_4$ and $H_2$. Additional components such as argon or nitrogen may be added to the etchant gas mixture. According to an exemplary embodiment, $CH_4$ and $H_2$ form the etchant gas mixture with $CH_4$ having a weight percentage within the etchant gas mixture ranging from 4 to 20%. Other mixtures may be used alternatively. The gas flow rate of the etchant gas mixture may range from 50 to 100 sccm (standard cubic centimeters per minute) when carried out in a Plasma-Therm™ 400 series reactor using a 14 inch $Al_2O_3$ coated aluminum susceptor plate. The use of the Plasma-Therm etcher is intended to be exemplary only, and the present invention may be carried out using any of various RIE etching tools currently available in the art. Gas flow rates may vary accordingly for other reactors and may also include values outside of the 50–100 sccm range when the Plasma-Therm™ 400 system is used. During the reactive ion etching process, various etching powers may be used, and in an exemplary embodiment, the etching power may range from 50–200 watts. In an exemplary embodiment, the etching pressure may fall within the range of 20–100 millitorr (mT) but other pressures and powers may be used alternatively.

Figure 4:
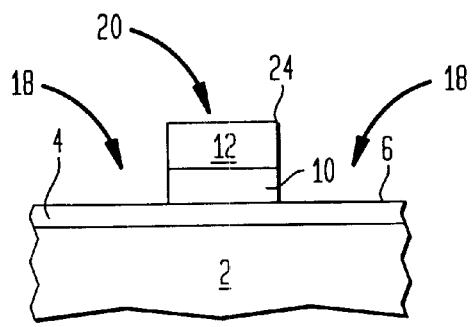
FIG. 4 is a cross-sectional view showing a first exemplary embodiment of a waveguide structure.
Figure 9:
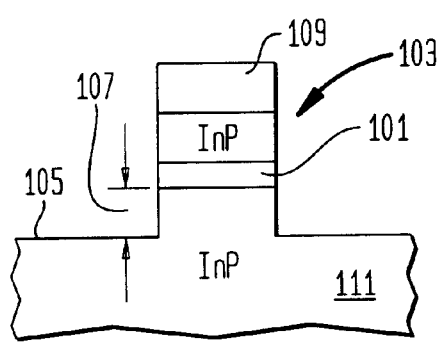
FIG. 9 is a cross-sectional view showing an embodiment of a waveguide device as in the prior art.
Figure 11:
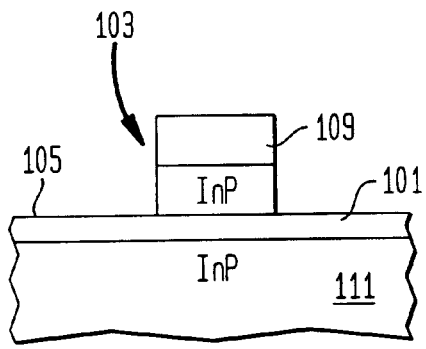
FIG. 11 is a cross-sectional view showing yet another embodiment of a waveguide device formed according to the prior art.
Figure 10:
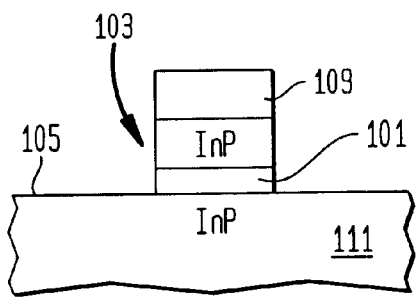
FIG. 10 is a cross-sectional view showing another embodiment of a waveguide device formed according to the prior art.
Figure 12:
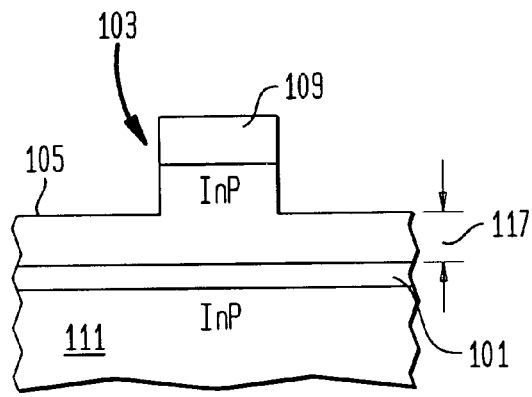
FIG. 12 is a cross-sectional view showing another embodiment of a waveguide device formed according to the prior art.

FIG. 4 shows the structure of FIG. 3 after it has been etched using the above-described etching process, and also after masking material 16 has been removed. Masking material 16 (not shown) may be removed using conventional methods after the etching process is complete. It can be seen in FIG. 4, that mesa structure 24, which forms the semiconductor waveguide device, is formed of upper cladding layer 12 and waveguide layer 10. It can be further seen that top surface 6 of InAlAs layer 4 forms the base surface above which mesa structure 24 extends. This is so because InAlAs layer 4 essentially does not etch using the etch chemistry of $CH_4/H_2$ and the etch conditions as described above. In this manner, InAlAs layer 4 serves as the etch-stop layer. It can be seen that portions of upper cladding layer 12 and waveguide layer 10 have been completely removed from exposed regions 18, and remain only in protected region 20.

FIG. 5 shows a perspective view of the first exemplary embodiment of the waveguide structure as shown in FIG. 4. Mesa structure 24 forms the semiconductor waveguide device and includes upper cladding layer 12 formed over waveguide layer 10. Mesa structure 24 includes sidewalls 28 and 26 of films 12 and 10, respectively. Sidewalls 28 and 26 combine to form a planar surface which forms angle 22 with the horizontal. Depending on specific etching conditions chosen, angle 22 may range from 88 to 90 degrees in the preferred embodiment. According to an exemplary embodiment, width 30 may range from 1 to 5 microns, but other suitable widths may be used. In the preferred embodiment, a width of approximately 2–3 microns may be used. Length 32 of mesa structure 24 which forms the waveguide structure, may vary from 500 to 1500 microns according to various exemplary embodiments. According to an exemplary embodiment, length 32 may be on the order of 1000 microns.

It should be emphasized that this point, however, that semiconductor waveguide devices including various structures and dimensions may be formed using upper cladding layer 12 and waveguide layer 10 according to the above-described process. Length 32 and width 30 may vary depending on device application. Thicknesses and relative thicknesses of the various films used may be varied depending on the intended application and the degree of beam confinement, far field, and optical coupling characteristics desired. It should be further understood that, during the fabrication sequence as described above, a multiplicity of several waveguide devices may be simultaneously formed according to the process described above by using an appropriate masking pattern. An aspect of the present invention is that, since InAlAs layer 4 does not etch using the above-described etching conditions, regardless of local variations and the thicknesses of films 12 and 10, the etch process will uniformly stop at top surface 6 of InAlAs layer 4. As such, the structures formed may include any of various cladding layers is and waveguide layers formed above the InAlAs layer, provided the layers are capable of being etched using the $CH_4/H_2$ etch process.

FIG. 6 shows a second exemplary embodiment of a stack of films used to form a semiconductor waveguide device according to the present invention. Like reference numbers refer to like elements previously described, and it can be seen that the second exemplary embodiment shown in FIG. 6, additionally includes lower cladding layer 34 having thickness 36 and which is formed above top surface 6 of InAlAs layer 4.

Lower cladding layer 34 may be used for at least two reasons. Lower cladding layer 34 may be chosen to include a more suitable refractive index than InAlAs layer 4, depending on the refractive indices of upper cladding layer 12 and waveguide layer 10 also used and in conjunction with the light beam confining qualities desired. Waveguide layer 34 will be formed of a suitable material which is etchable using the etching chemistry described above. As such, the inclusion of lower cladding layer 34 also provides for a waveguide structure to be fabricated in which waveguide layer 10 is spaced above the base surface. This will be shown in FIG. 8. It will be seen that waveguide layer 10 extends above the base surface by a distance which is equal to thickness 36 of lower cladding layer 34.

Lower cladding layer 34 is formed sequentially after InAlAs layer 4 and prior to waveguide layer 10. Various materials may be used to form lower cladding layer 34. According to an exemplary embodiment, conventional techniques, such as MOCVD, may be used to form lower cladding layer 34, which additionally may be P-type or N-type doped, depending on intended application and desired optical qualities. In an exemplary embodiment, lower cladding layer 34 may be a P-type InP layer, upper cladding layer 12 may also be a P-type InP cladding layer, and waveguide layer 10 may be an intrinsic InGaAs layer as described in conjunction with FIG. 2. According to another exemplary embodiment, waveguide layer 10 may be an InGaAsP layer.

Now turning to FIG. 7, a pattern using masking film 16 which includes exposed regions 18 and protected or patterned region 20 may be formed over upper cladding layer 12. Masking layer 16 may be a conventional masking film such as silicon dioxide or photoresist, and conventional methods available in the art may be used to form the pattern. An exemplary method may be to photolithographically form a pattern in a photoresist material.

The structure shown in FIG. 7 is then subjected to the etching conditions as described in conjunction with the first exemplary embodiment. The etching process sequentially etches upper cladding layer 12, waveguide layer 10, and lower cladding layer 34 thereby removing the aforementioned films from exposed regions 18. Also as in the first embodiment, InAlAs layer 4 is etch resistant, so the etching process stops at top surface 6 of InAlAs layer 4. In this manner, InAlAs layer 4 serves as the etch-stop layer.

FIG. 8 shows the structure shown in FIG. 7 after the etching process, as described above, has been carried out, and after masking film 16 has thereafter been removed using conventional methods. It can be seen that mesa structure 40 results. Mesa structure 40 forms the semiconductor waveguide device and includes waveguide layer 10 disposed between upper cladding layer 12 and lower cladding layer 34. Waveguide layer 10 is disposed by height 36 above top surface 6 of InAlAs layer 4, which forms the base above which mesa 40 extends. As in the first exemplary embodiment, various thicknesses may be used for each of films 12, 10, and 34 depending on the degree of beam confinement and other optical qualities sought. Width 42 and length 44 may be chosen appropriately: in an exemplary embodiment width 42 may range from 1 micron to 5 microns and length 44 may range from 500 to 1500 microns. In the preferred embodiment, width 42 may be 2–3 microns. It should be understood, however, that various other widths and lengths may be used alternatively. It can be seen that sidewall 38 of lower cladding film 34, sidewall 26 of waveguide layer 10, and sidewall 28 of upper cladding layer 12 combine to form a planar sidewall surface.

As described in conjunction with the first exemplary embodiment, during the fabrication sequence detailed in reference to FIGS. 6–8, multiple waveguide devices shown may be simultaneously formed by using the appropriate masking pattern.

It should be emphasized at this point that the foregoing exemplary embodiments are intended to be exemplary only. The present invention provides an etch stop layer of InAlAs which is resistant to etching using the $CH_4/H_2$ RIE etch processes which are commonly used to etch the layers which combine to form semiconductor waveguide devices. As such, any combination of layers formed above the InAlAs etch stop layer, may be used provided that they may be etched using the above-described $CH_4/H_2$ etching process. For example, multiple waveguide layers formed between multiple cladding layers may be formed above the InAlAs layer of the present invention, then etched. Furthermore, any of various layers which may be etched using the $CH_4/H_2$ etch chemistry may be used to form the various cladding and waveguide layers as the present invention is not intended to be limited to the exemplary materials referred to above. Furthermore, the physical structure and dimensions of the waveguide structure may be varied depending on the degree of beam confinement, and other optical qualities, sought. For example, is any of various film thicknesses of a lower cladding layer or layers may be used to position the waveguide layer at a desired height above a base surface.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principals of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents such as equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed:

1. A method for forming a semiconductor waveguide device, comprising the steps of:
   (a) providing a semiconductor substrate;
   (b) forming an InAlAs layer over the substrate;
   (c) forming a waveguide layer over the InAlAs layer;
   (d) forming a cladding layer over the waveguide layer;
   (e) forming a pattern in a masking film formed over the cladding layer, the pattern including a masked region covered by the masking film and exposed regions; and
   (f) etching the exposed regions using an etchant gas mixture including $CH_4$ and $H_2$.

2. The method as in claim 1, wherein the substrate comprises silicon and further comprising step (a1) forming a further cladding layer over the substrate prior to forming the InAlAs layer, and wherein step (b) includes forming the InAlAs layer over the further cladding layer.

3. The method as in claim 1, wherein step (c) comprises forming a waveguide layer of InGaAs.

4. The method as in claim 1, wherein step (c) comprises forming a waveguide layer of InGaAsP.

5. The method as in claim 1, wherein step (d) comprises forming a cladding layer of P-type InP.

6. The method as in claim 1, in which step (f) includes sequentially removing the cladding layer and the waveguide layer.

7. The method as in claim 1, in which step (b) includes forming one of an N-type InAlAs layer and a P-type InAlAs layer.

8. The method as in claim 1, in which step (e) includes forming a waveguide pattern having a length within the range of 500 microns to 1500 microns, and a width within the range of 1 micron to 5 microns.

9. The method as in claim 1, in which step (f) includes the $CH_4$ having a weight percentage ranging from 4% to 20% of the etchant gas mixture.

10. The method as in claim 1, in which step (f) includes an etch power within the range of 50 watts to 200 watts.

11. The method as in claim 1, in which step (f) includes a pressure within the range of 20 millitorr to 100 millitorr.

12. The method as in claim 1, in which step (f) includes the etchant gas mixture having a flow rate within the range of 50 sccm to 100 sccm.

13. The method as in claim 1, further comprising step (b1) forming a further cladding layer over the InAlAs layer and wherein step (c) comprises forming the waveguide layer over the further cladding layer.

14. The method as in claim 13, wherein the further cladding layer comprises a layer of P-type InP.

15. The method as in claim 13, in which step (f) includes sequentially removing the cladding layer, the waveguide layer and the further cladding layer.

16. The method as in claim 1, in which each of steps (b), (c), and (d) include metallo-organic chemical vapor deposition (MOCVD).

17. A semiconductor waveguide device comprising a waveguide layer, a first cladding layer being superjacent the waveguide layer, and an InAlAs cladding layer being subjacent the waveguide layer.

18. The semiconductor waveguide device as in claim 17, wherein the InAlAs cladding layer includes a thickness of at least 50 Angstroms.

19. The semiconductor waveguide device as in claim 17, wherein the first cladding layer is a P-type material, the waveguide layer is an un-doped material and the InAlAs cladding layer is a P-type material.

20. The semiconductor waveguide device as in claim 17, wherein the InAlAs cladding layer is a continuous base surface and the waveguide layer and the first cladding layer form a composite mesa structure which extends above the base surface.

21. The semiconductor waveguide device as in claim 20, wherein the composite mesa structure has a length with the range of 500 microns to 1500 microns and a width within the range of 1 micron to 5 microns.

22. The semiconductor waveguide device as in claim 17 further comprising a second cladding layer interposed between the waveguide layer and the InAlAs cladding layer.

23. The semiconductor waveguide device as in claim 22, wherein the first cladding layer comprises InP, the second cladding layer comprises InP, and the waveguide layer comprises one of InGaAs and InGaAsP.

24. The semiconductor waveguide device as in claim 23, wherein the InAlAs cladding layer is a continuous base surface and the second cladding layer, the waveguide layer, and the first cladding layer form a composite mesa structure which extends above the base surface.

25. The semiconductor waveguide device as in claim 24, wherein the second cladding layer, the waveguide layer, and the first cladding layer have respective sidewalls which form a substantially planar surface.

* * * * *